(12) United States Patent
Abou-Khalil et al.

(10) Patent No.: US 8,891,212 B2
(45) Date of Patent: Nov. 18, 2014

(54) RC-TRIGGERED SEMICONDUCTOR CONTROLLED RECTIFIER FOR ESD PROTECTION OF SIGNAL PADS

(75) Inventors: Michel J. Abou-Khalil, Essex Junction, VT (US); Robert J. Gauthier, Jr., Hinesburg, VT (US); Tom C. Lee, Essex Junction, VT (US); Junjun Li, Williston, VT (US); Souvick Mitra, Essex Junction, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 685 days.

(21) Appl. No.: 13/079,946

(22) Filed: Apr. 5, 2011

(65) Prior Publication Data

US 2012/0257317 A1 Oct. 11, 2012

(51) Int. Cl.
*H02H 9/04* (2006.01)
*H03K 19/003* (2006.01)
*H01L 27/02* (2006.01)

(52) U.S. Cl.
CPC ......... *H02H 9/046* (2013.01); *H03K 19/00361* (2013.01); *H01L 27/0262* (2013.01)
USPC ....................................................... 361/56

(58) Field of Classification Search
CPC ............ H01L 27/0262; H01L 27/0251; H01L 27/0255; H01L 27/0266; H02H 9/046; H03K 19/00361
USPC ....................................................... 361/56
See application file for complete search history.

(56) References Cited

U.S. PATENT DOCUMENTS

| | | | |
|---|---|---|---|
| 5,530,612 A | 6/1996 | Maloney | |
| 5,751,507 A | 5/1998 | Watt et al. | |
| 7,187,527 B2 | 3/2007 | Su et al. | |
| 7,518,164 B2 | 4/2009 | Smelloy et al. | |
| 7,615,417 B2 | 11/2009 | Manna et al. | |
| 7,667,243 B2 | 2/2010 | Duvvury et al. | |
| 7,763,940 B2 | 7/2010 | Mergens et al. | |
| 7,825,429 B2 | 11/2010 | Vinson | |

(Continued)

OTHER PUBLICATIONS

Lai, et al., "A Novel SCR ESD Protection structure with Low-Loading and Latchup Immunity for High-Speed I/O Pad", 2003 IEEE, pp. 80-83.
Ker, et al., "Overview of On-Chip Electrostatic Discharge Protection Design with SCR-Based Devices in CMOS Integrated Circuits", 2005 IEEE.

(Continued)

*Primary Examiner* — Jared Fureman
*Assistant Examiner* — Nicholas Ieva
(74) *Attorney, Agent, or Firm* — Wood, Herron & Evans, LLP; Anthony J. Canale

(57) ABSTRACT

RC-trigger circuits for a semiconductor controlled rectifier (SCR), methods of providing electrostatic discharge (ESD) protection, and design structures for a RC-trigger circuit. The RC-trigger circuit is coupled to an input/output (I/O) signal pad by an isolation diode and is coupled to a power supply voltage by a power supply diode. Under normal operating conditions, the isolation diode is reverse biased, isolating the RC-trigger circuit from the input/output (I/O) pad, and the power supply diode is forward biased so that the RC-trigger circuit is supplied with power. The isolation diode may become forward biased during ESD events while the chip is unpowered, causing the RC-trigger circuit to trigger an SCR configured protect the signal pad from ESD into a conductive state. The power supply diode may become reverse biased during the ESD event, which isolates the power supply rail from the ESD voltage pulse.

24 Claims, 7 Drawing Sheets

(56) References Cited

U.S. PATENT DOCUMENTS

| | | | |
|---|---|---|---|
| 8,039,868 B2* | 10/2011 | Gauthier et al. | 257/173 |
| 2006/0109595 A1* | 5/2006 | Watanabe et al. | 361/56 |
| 2009/0268359 A1* | 10/2009 | Chatty et al. | 361/56 |
| 2010/0155775 A1 | 6/2010 | Gauthier, Jr. et al. | |
| 2012/0154960 A1* | 6/2012 | Tsai et al. | 361/56 |

OTHER PUBLICATIONS

Mergens, et al., "Advanced SCR ESD Protection Circuits for CMOS/SOI Nanotechnologies", 2005 IEEE.

Russ, et al., GGNMOS Triggered Silicon Controlled Rectifiers for ESD Protection in Deep Sub-Micron CMOS Processes, 2001 EOS/ESD Symposium.

\* cited by examiner

RC-TRIGGERED SEMICONDUCTOR CONTROLLED RECTIFIER FOR ESD PROTECTION OF SIGNAL PADS

BACKGROUND

The present invention relates generally to semiconductor device fabrication and, more particularly, to electrostatic discharge (ESD) circuits for protecting an Input/Output (I/O) signal pad in radio frequency and other high frequency signal applications, as well as methods for providing ESD protection and design structures for an ESD protection circuit.

Modern electronics achieve high levels of functionality in small form factors by integrating multiple functions onto a single chip. A common fabrication process that allows high levels of integration at a relatively low cost is Complementary Metal-Oxide-Semiconductor (CMOS). CMOS processes build a combination of p-type and n-type metal-oxide-semiconductor field-effect transistors (MOSFETs) to implement logic gates and other types of digital circuits.

Chips may be exposed to electrostatic discharge (ESD) events leading to potentially large and damaging currents within the integrated circuit. Increasing integration densities and performance demands on CMOS chips have resulted in reduced device dimensions. The reduction in dimensions has increased the susceptibility of integrated circuits to ESD events. Manufacturers, assemblers, and users of integrated circuits must take precautions to avoid unintentionally causing ESD events. For example, ESD prevention can be incorporated into the integrated circuit and may include special design techniques for I/O pins and pads to prevent damage to the chip during handling from the time that the chip is manufactured until the time that the chip is installed on a circuit board.

High frequency circuit applications require ESD protection circuits that can handle sufficient ESD current levels but that do not add significant parasitic capacitance to the signal pad. Semiconductor Controlled Rectifier (SCR) circuits, which offer both low capacitance and high failure currents, may be used to provide ESD protection in CMOS applications. SCR devices used for ESD protection typically require a trigger circuit in order to respond to ESD events at a voltage that is sufficiently low to protect integrated circuits of CMOS chips. One such trigger circuit that provides both fast transient turn on and low trigger voltages for an SCR is a resistor-capacitor (RC) trigger circuit.

Therefore, improved RC-trigger circuits for an SCR, as well as methods, and design structures for SCR RC-trigger circuits are needed for protecting integrated circuits against ESD events.

BRIEF SUMMARY

In one embodiment, a circuit is provided for protecting an integrated circuit from an electrostatic discharge (ESD) event. The circuit includes a signal pad, a trigger circuit, a semiconductor-controlled rectifier (SCR) connected with the trigger circuit, and a diode connecting the trigger circuit with the signal pad. When the integrated circuit is powered, the diode is configured to isolate the signal pad from the trigger circuit. In response to the ESD event and while the integrated circuit is unpowered, the diode is configured to couple the signal pad to the trigger circuit.

In another embodiment, a method is provided for fabricating an integrated circuit with protection from an ESD event. The method includes connecting a signal pad to an SCR and connecting the SCR to a trigger circuit configured to maintain the SCR in a high impedance state in the absence of an ESD event and to trigger the SCR into a low impedance state in response to the ESD event. The method further includes connecting the signal pad to the trigger circuit with a diode configured to isolate the signal pad from the trigger circuit when the integrated circuit is powered and to couple the signal pad to the trigger circuit in response to the ESD event and while the integrated circuit is unpowered.

In another embodiment, a method is provided for protecting an integrated circuit from an electrostatic discharge (ESD) event at a signal pad. The method includes isolating a trigger circuit from the signal pad in response to the integrated circuit being powered. The method further includes coupling the trigger circuit to the signal pad in response to the ESD event and while the integrated circuit is unpowered.

In an embodiment of the invention, a hardware description language (HDL) design structure is encoded on a machine-readable data storage medium. The HDL design structure comprises elements that, when processed in a computer-aided design system, generates a machine-executable representation of a circuit for protecting an integrated circuit during an electrostatic discharge (ESD) event. The HDL design structure includes a signal pad, a trigger circuit, a semiconductor-controlled rectifier connected with the trigger circuit, and a diode connecting the trigger circuit with the signal pad. When the integrated circuit is powered, the first diode is configured to isolate the signal pad from the trigger circuit. In response to the ESD event and while the integrated circuit is unpowered, the first diode is also configured to couple the signal pad to the trigger circuit. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Embodiments of the invention are related to an ESD protection circuit for an input/output (I/O) signal pad of an integrated circuit, or chip. The ESD protection circuit includes a semiconductor controlled rectifier (SCR) and an RC-trigger circuit coupled to the signal pad by an isolation diode. During normal operation, the isolation diode is reverse biased, so that the RC-trigger circuit is electrically isolated from the signal pad. When the chip is unpowered (whether the chip is loose or is installed (e.g., surface mounted) on a printed circuit board), an electro-static discharge (ESD) event may forward bias the isolation diode, thereby causing the RC-trigger circuit to trigger the SCR so that the ESD current is shunted away from the signal pad to a chip voltage supply rail. The ESD protection is provided with reduced capacitive loading of the protected signal pad. An additional diode, which may implemented as a diode-connected transistor string, may couple the RC-trigger circuit to a power pad to provide reverse biasing of the isolation diode during normal operation, and to isolate the power pad from ESD events.

Figure 1A:
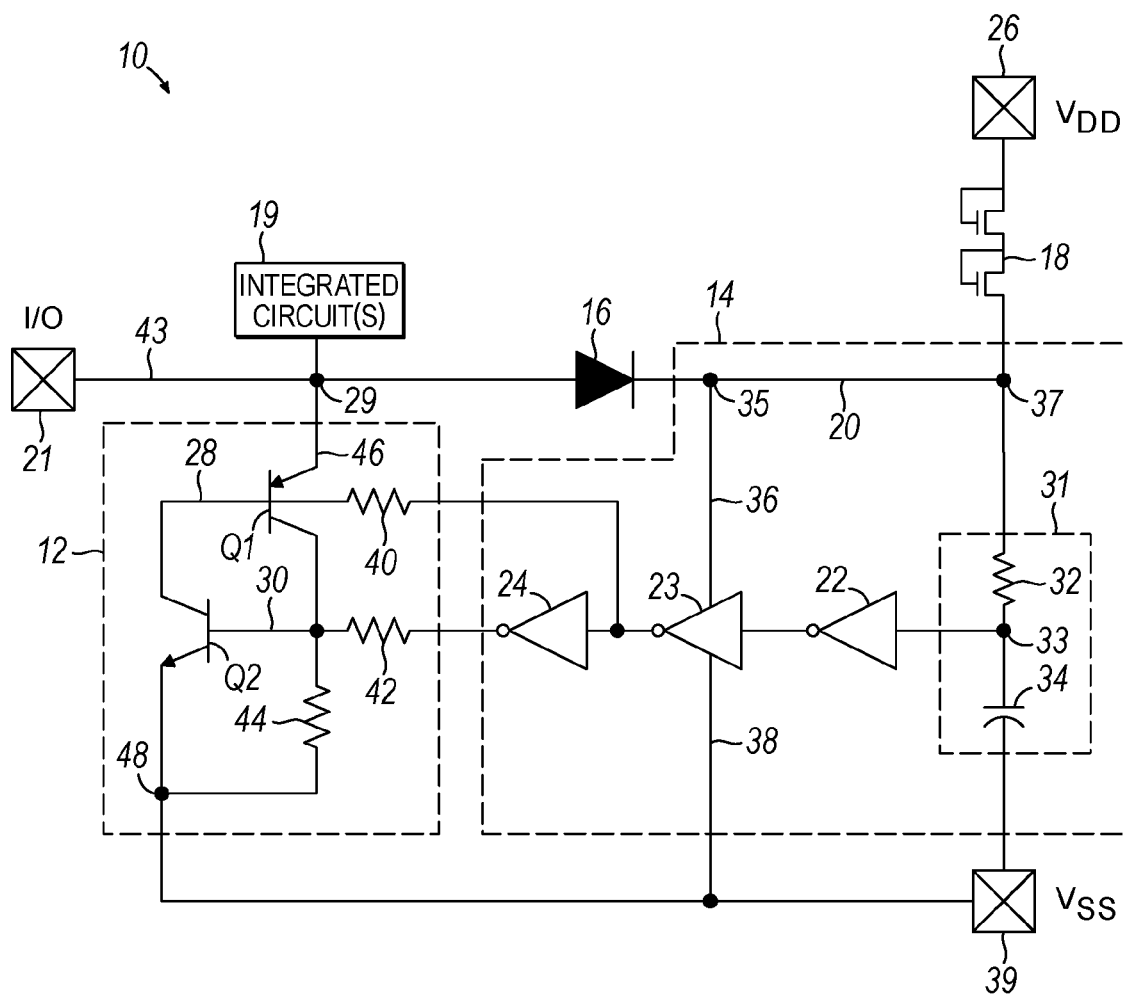
FIG. 1A is a diagrammatic view illustrating the electrical configuration of an ESD protection circuit used to provide protection against positive voltage ESD pulses directed to an I/O signal pad coupled with an I/O pin.

With reference to FIG. 1A and in accordance with an embodiment of the invention, an ESD protection circuit 10 used for positive-voltage ESD protection includes an SCR 12, a resistor-capacitor (RC) trigger circuit 14, a pad isolation diode 16, and a diode-connected transistor string 18. The SCR 12 may be comprised of adjacent regions of alternating n-type and p-type semiconductor configured to form a PNPN structure having p-n junctions between the adjacent regions. The adjacent regions may be vertically adjacent in a stacked device arrangement, horizontally adjacent in a planar device arrangement, or the PNPN structure may include combinations of vertically and horizontally adjacent semiconductor regions. By way of a specific example, the SCR 12 may include a first n-well region and a first p-well region formed in the active region of a bulk semiconductor or semiconductor-on-insulator (SOI) substrate. The first n-well region and the first p-well region may have exposed co-planar top surfaces, and may be laterally adjacent so that they share a vertical boundary forming a butted p-n junction. An anode 46 of SCR 12 may then be formed by a second p-well located laterally within and having a shallower depth than the first n-well. The second p-well forming the anode 46 may be a p$^+$ contact region formed within the first n-well. The second p-well may thereby form an island of p-type semiconductor having a top surface coplanar with the first n-well and forming a p-n junction at the boundary between the second p-well and first n-well. Similarly, a cathode 48 of SCR 12 may be formed by a second n-well located laterally within and having a shallower depth than the first p-well. The second n-well forming the cathode 48 may be an n$^+$ contact region formed within the first p-well. The second n-well may thereby form an island of n-type semiconductor having a top surface coplanar with the first p-well and forming a p-n junction at the boundary between the second n-well and first p-well.

A PNP bipolar transistor Q1 may be formed by three adjacent regions of the PNPN structure. An emitter region of the transistor Q1 may be comprised of the anode 46 of SCR 12. A base region of the transistor Q1 may be comprised of an SCR n-trigger gate 28 defined by the first n-well of SCR 12. A collector region of the transistor Q1 may be comprised of the first p-well of SCR 12. An NPN bipolar transistor Q2 may be formed by three adjacent regions of the PNPN structure. A base region of transistor Q2 shares the same p-region of SCR 12 as the collector of transistor Q1 and forms a p-trigger gate 30 of transistor Q2. A collector region of transistor Q2 shares the same n-region of SCR 12 with the base of transistor Q1. The emitter region of transistor Q2 may be defined by the cathode 48 of SCR 12.

The SCR 12 may be used to provide ESD protection to sensitive devices of integrated circuit(s) 19 on the chip, which are electrically coupled to an I/O signal pad 21 though signal path 43. To protect against positive voltage ESD pulses, the anode 46 of SCR 12 may be electrically coupled to the integrated circuit(s) 19 and signal path 43 at a signal node 29. The cathode 48 of SCR 12 may be electrically coupled to a power pad 39, which is electrically coupled to a negative chip supply voltage, $V_{SS}$, during operation. An ESD path for positive voltage ESD pulses is thereby defined through the transistors Q1, Q2 from the signal pad 21 to the power pad 39. Under normal operating conditions, the SCR 12 will present a high impedance between the signal node 29 and $V_{SS}$, so that the signals passing through signal path 43 to the integrated circuit(s) 19 may be relatively unaffected by the SCR 12. When an ESD event occurs, the SCR 12 may enter into a low impedance state, providing a current path between the signal node 29 and $V_{SS}$ so that the ESD current is shunted away from the integrated circuit(s) 19. The SCR may thereby prevent ESD voltages from damaging the integrated circuit(s) 19.

Electrical contacts with the n-trigger and p-trigger gates 28, 30 may be formed by resistive contact regions of more highly doped semiconductor having the same conductivity type as the first n-well and p-well, respectively. Resistor 40 may thereby be formed by the resistance to electrical current provided by the first n-well between the n-trigger contact and the body of the first n-well, which may be analogous to the base resistance of Q1. Likewise, resistors 42 and 44 may be formed by the resistance to the flow of electrical current provided by the first p-well between the p-trigger contact, an additional first p-well contact separate from the p-trigger contact, and the body of the first p-well.

The SCR 12, RC-trigger circuit 14, pad isolation diode 16, diode-connected transistor string 18, and integrated circuit(s) 19 may be fabricated as part of a CMOS or BiCMOS chip. As understood by a person having ordinary skill in the art of semiconductor fabrication, standard CMOS or BiCMOS fabrication processes may be employed using a suitable substrate, such as a bulk semiconductor substrate or a device layer of an SOI substrate. For example, the SCR 12 may be formed by masking, implanting dopants of suitable impurity species with suitable kinetic energies, and thermally activating the implanted dopants. It is further understood that there are numerous ways of forming SCR devices and the embodiments of the invention are not limited to any specific SCR structure or method of fabricating the SCR 12.

To improve the response of SCR 12 to an ESD event, the RC-trigger circuit 14 may trigger the SCR 12 into a low impedance state. The RC-trigger circuit 14 may operate to lower the ESD voltage at which the SCR 12 enters a low impedance state, when the chip is unpowered, by providing a trigger voltage to one or both of the n-trigger and p-trigger gates 28, 30. Conversely, when the chip and integrated circuit(s) 19 are in a powered state, the RC-trigger circuit 14 operates to isolate the signal pad 21 from the RC-trigger circuit 14 and to increase the SCR impedance, thereby reducing the effect of parasitic capacitances on the signal pad 21.

The RC-trigger circuit 14 includes a supply line 20, inverters 22-24, and a resistor-capacitor (RC) circuit 31. RC circuit 31 includes a resistor 32 and a capacitor 34 connected in series, which forms a common node 33 between the resistor 32 and capacitor 34. RC circuit 31 is electrically coupled to the cathode of diode-connected transistor string 18 at node 37, node 37 being between the resistor 32 and the diode-connected string 18. The cathode of isolation diode 16 may be electrically coupled to an inverter positive supply node 35, and the anode of the isolation diode 16 may be electrically coupled to signal node 29, so that the pad isolation diode 16 connects the signal node 29 to the supply node 35. The anode of the transistor string 18 may be electrically coupled to the power pad 26, so that node 37 is connected to power pad 26 by transistor string 18. Inverters 22-23 may be supplied with power by a positive power supply input 36 and a negative power supply input 38, which may be electrically coupled to power pad 39. The supply line 20 may connect node 35 to node 37, so that the cathode of the diode-connected transistor string 18, the resistor 32, the cathode of isolation diode 16, and the positive power supply input 36 of the inverters 22-24 are electrically coupled to each other by supply line 20. Thus, as illustrated in FIG. 1A, the supply line 20 is electrically coupled to a signal pad 21 by the pad isolation diode 16 and to the power pad 26 by the diode-connected transistor string 18.

In one embodiment, the diode-connected transistors in the string 18 may be diode-connected NFETs. A diode-connected NFET may be formed by electrically coupling the drain to the gate of the NFET. The resulting structure may have an anode formed by the drain of the NFET and a cathode formed by the source of the NFET. In operation, the drain and gate of the NFET may be at the same potential with respect to the source of the NFET, so that a positive drain-to-source voltage, or $V_{DS}$, will result in a substantially equal positive gate to source voltage, or $V_{GS}$. A positive $V_{GS}$ may increase the number of carriers in the NFET channel, enhancing channel conductivity and reducing the resistance between the drain and source of the NFET. The drain-to-source current flowing through the NFET may thereby increase exponentially with increases in $V_{DS}$. Conversely, a negative $V_{GS}$ may cause the carriers in the NFET channel to be depleted so that the channel is cut-off, causing the NFET to become non-conductive so that little or no current is conducted in the reverse direction. The diode-connected NFET may thereby provide forward and reverse current characteristics similar to that of a p-n junction diode. Because the reverse breakdown voltage of a diode-connected NFET may be limited by the breakdown voltage of the gate dielectric, multiple diode-connected NFETs may be connected in series to reduce the magnitude of $V_{GS}$ at each NFET, thereby increasing the voltage handling ability of the diode-connected NFET string. It will be understood by persons having ordinary skill in the art that diode-connected transistors may also be formed from other types of transistors, such as PFET and bipolar transistors. Embodiments are thus not limited to diode-connected transistor strings employing NFET transistors.

Figure 1B:
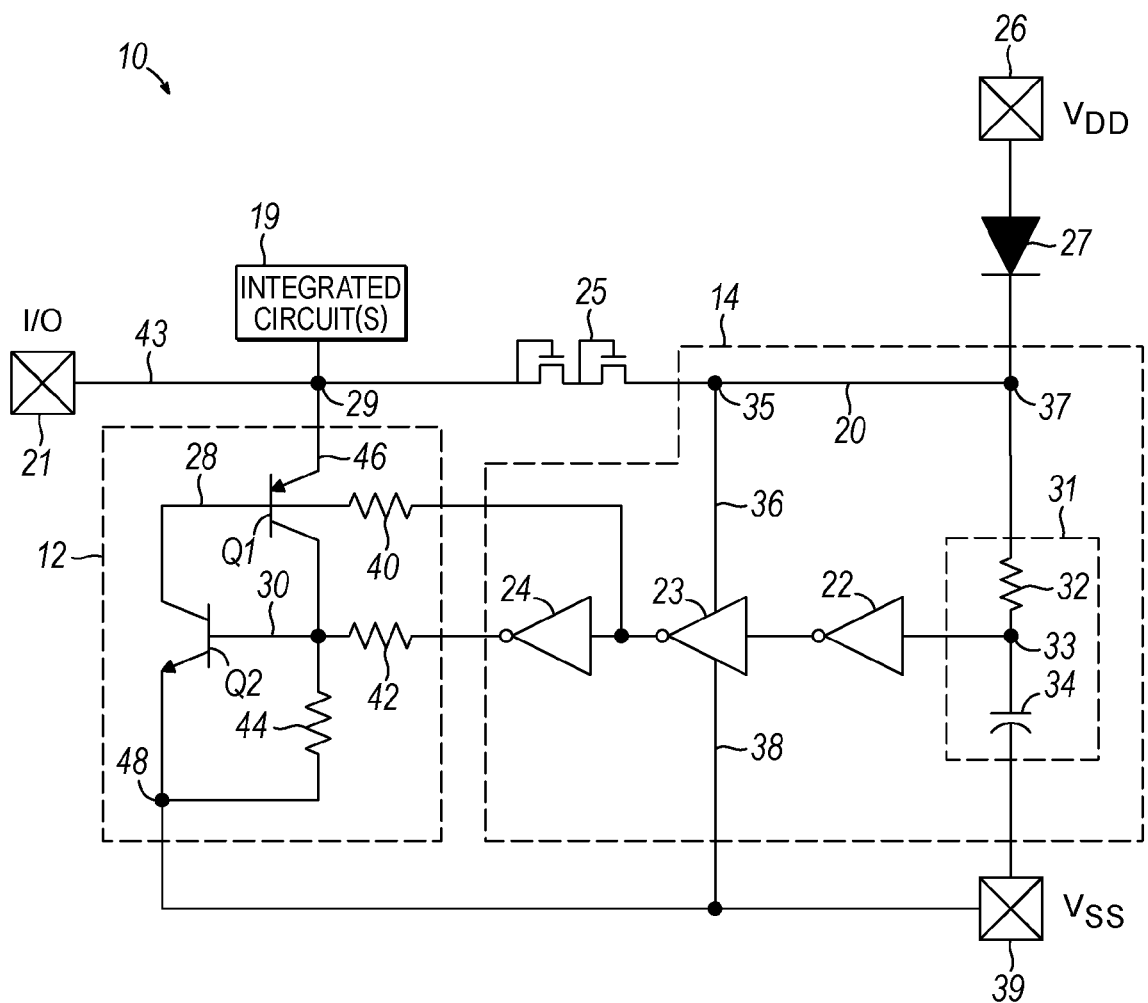
FIG. 1B is a diagrammatic view similar to FIG. 1A illustrating an alternative electrical configuration of an ESD protection circuit used to provide protection against positive voltage ESD pulses directed to an I/O signal pad coupled with an I/O pin.
Figure 1C:
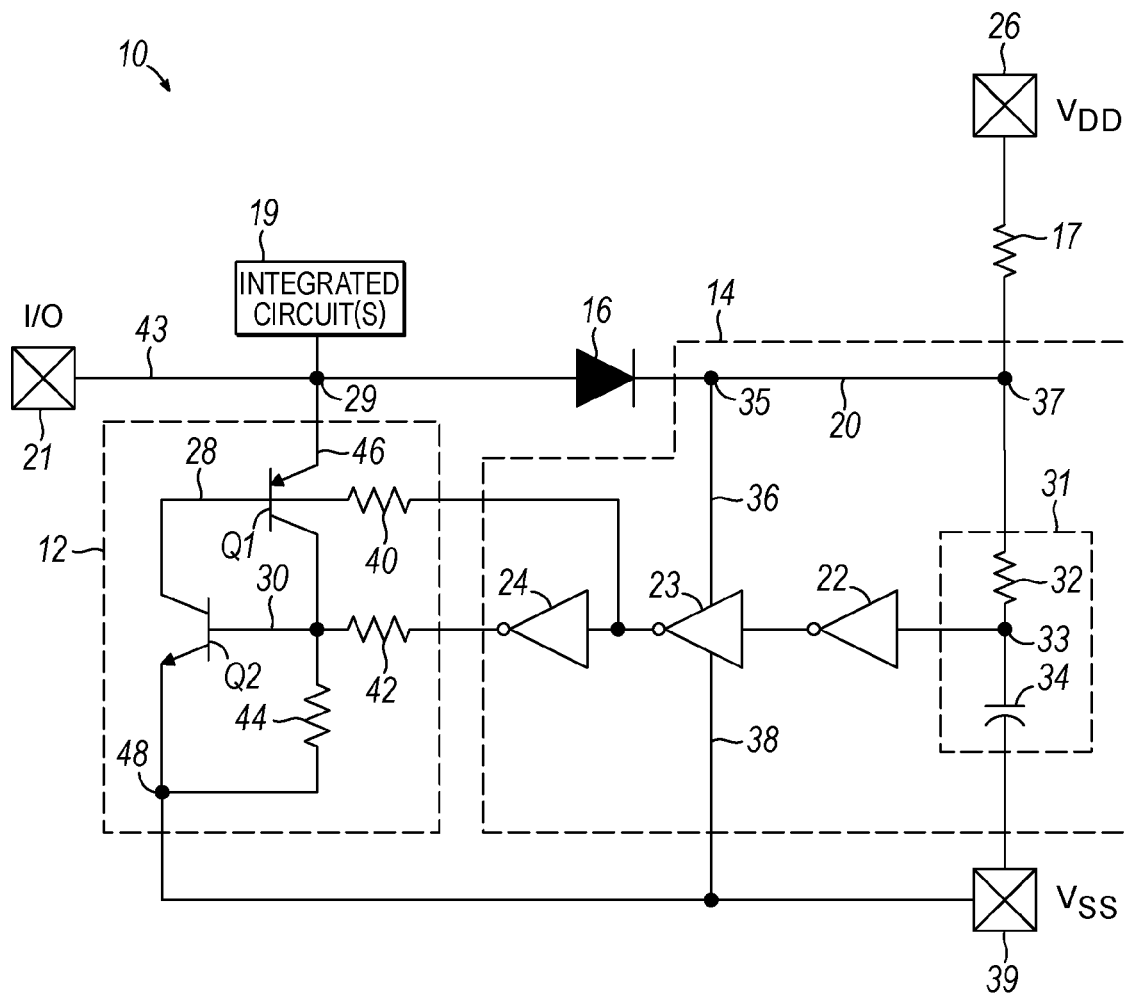
FIG. 1C is a diagrammatic view similar to FIG. 1A illustrating another alternative electrical configuration of an ESD protection circuit used to provide protection against positive voltage ESD pulses directed to an I/O signal pad coupled with an I/O pin.

Although the diode-connected transistor string 18 is shown in FIG. 1A as having two diode-connected transistors, it is understood that the transistor string 18 may include more than two diode-connected transistors, or may be comprised of a single diode-connected transistor. It is further understood that a diode, as used herein, may include any two-terminal unidirectional device that conducts electric current primarily in only one direction, such as a p-n junction diode or a diode-connected transistor. Thus, in alternative embodiments of the invention, the diode 16 may be replaced a diode-connected transistor string 25, and/or the transistor string 18 may be replaced by a diode 27, as illustrated in FIG. 1B. It is therefore understood that either type of device may be used interchangeably in either position. In another alternative embodiment, the diode-connected transistor string 18 may be replaced by a large resistor 17 (e.g., greater than or equal to 100 kΩ) as shown in FIG. 1C.

The inverters 22-24 may be connected in series, with the signal output of inverter 23 electrically coupled to the n-trigger gate 28 by resistor 40, and the signal output of inverter 24 electrically coupled to the p-trigger gate 30 by a resistor 42, so that inverters 23 and 24 may provide trigger signals to the SCR 12. The p-trigger gate 30 may also be electrically coupled to the power pad 39 by resistor 44.

Although illustrated in a double-triggered SCR configuration in FIG. 1A, the SCR 12 may also be configured as a single-triggered SCR, in which case only one of either the n-trigger gate 28 or the p-trigger gate 30 would be electrically coupled to its respective inverter signal output. In addition, because the n-trigger gate 28 is driven with a logic signal that is not inverted with respect to the voltage on capacitor 34, one or more non-inverting logic buffer amplifiers may be used to couple the RC circuit 31 to the n-trigger gate 28 in place of one or more of the inverters 22-24.

The signal input of inverter 22 is electrically coupled to the supply line 20 by resistor 32 and is electrically coupled to the power pad 39 by capacitor 34 so that the response of the inverter output to changes in the supply line voltage may be delayed. The positive power supply input 36 for the inverters 22-24 may be electrically coupled to the supply line 20, and the negative power supply input 38 for the inverters 22-24 may electrically coupled to the power pad 39 so that the inverters 22-24 are supplied with power whenever a sufficient voltage difference exists between the supply line 20 and power pad 39. To facilitate connections between the chip and external components such as a circuit board, signal pad 21, power pad 26, and power pad 39 may be electrically coupled to external signal and power pins (not shown), which may be part of a chip package.

Standard back-end-of-line (BEOL) processing may follow the formation of the ESD protection circuit 10 to form a BEOL interconnect structure. Each level of the BEOL interconnect structure may be fabricated by damascene processes, such as a dual damascene process in which a dielectric layer is deposited, vias and trenches are etched in the dielectric layer, and the vias and trenches are filled with a conductor using a single blanket deposition followed by planarization. The damascene process may be replicated to stack multiple wiring levels so that a multi-level, high density framework of conductive interconnections is formed. Damascene processes and materials used in damascene processes are understood by a person having ordinary skill in the art.

The BEOL interconnect structure may include one or more lower dielectric layers containing metallization that supplies local interconnect wiring, and one or more upper dielectric layers containing metallization for levels of interconnect wiring. The metallization may define a wiring path forming the signal path 43 coupling the signal pad 21 with the local interconnect wiring of the anode 46 of SCR 12, the anode of pad isolation diode 16, and the integrated circuit(s) 19. The metallization may define a wiring path coupling the power pad 26 with the local interconnect wiring for the diode-connected transistor string 18. The metallization may define a wiring path coupling the power pad 39 with the local interconnect wiring for the cathode 48 of SCR 12, the negative power supply input 38 of inverters 22-24, and the capacitor 34.

The signal pad 21, power pad 26, and power pad 39 may be fabricated using BEOL processes, such as layer deposition, photolithography and subtractive etching understood by a person having ordinary skill in the art. For example, the signal pad 21, power pad 26, and power pad 39 may be fabricated by depositing a layer stack including a top layer of aluminum (Al), copper (Cu), or an alloy (e.g., AlCu) onto the topmost level of the interconnect wiring and shaping the layer stack with one or more photolithography and etching processes.

In operation, power pad 26 may be electrically coupled to a positive chip supply voltage, such as $V_{DD}$, and power pad 39 may be electrically coupled to a negative chip supply voltage, such as ground or $V_{SS}$. Under these normal operating conditions, the diode-connected transistor string 18 may become forward biased, which electrically couples the supply line 20 to $V_{DD}$. Supply line 20 may thereby be biased to a voltage approaching $V_{DD}$. The resulting voltages appearing across the inverter power supply inputs 36, 38 may provide power to the inverters 22-24 as well as charge the capacitor 34 of RC-trigger circuit 14 through resistor 32. The resulting supply line voltages may also reverse bias the pad isolation diode 16. The resulting increase in the depletion region width may reduce the junction capacitance of the diode 16 and thereby electrically isolate the signal pad 21 from parasitic loading by the RC circuit capacitor 34 and the inverter string power supply input 36.

Shortly after power is applied to the chip, capacitor 34 may become sufficiently charged so that the input of inverter 22 is at or above a voltage level representing a logic high signal. In response, the output of inverter 22 may drive the input of inverter 23 low, causing the output of inverter 23 to apply a logic level high voltage to resistor 40, which drives the n-trigger gate 28 to a voltage at or slightly below the voltage applied to the positive power supply input 36. The n-trigger gate 28 may thus be provided with a voltage at or slightly below $V_{DD}$, depending on the voltage drops associated with the diode-connected transistor string 18 and within the inverter 23. The n-trigger gate 28 may thus be at a higher voltage than signal pad 21, which reverse biases the base-emitter junction of transistor Q1 and minimizes the parasitic capacitive loading of SCR 12 on signal pad 21 by increasing the width of the depletion region in the base-emitter junction. Similarly, the output of inverter 23 may drive the input of inverter 24 to a logic high state, so that the output of inverter 24 applies a logic level low voltage to resistor 42, which drives the p-trigger gate 30 to a voltage at or slightly above $V_{SS}$. Transistor Q2 may thereby be placed in an off state so the voltage on n-trigger gate 28 is not pulled down by transistor Q2, which maintains SCR 12 in a high impedance or non-conductive state.

The RC-trigger circuit 14 maintains the SCR 12 in the high impedance state when the chip is powered. In addition, the RC-trigger circuit 14 may reduce the parasitic capacitive loading on the signal pad 21 by reverse biasing the pad isolation diode 16 and the SCR base-emitter junction of transistor Q1. The RC-trigger circuit 14 may thereby offer reduced capacitive loading of signal pad 21 in comparison to conventional RC-triggered SCR ESD protection circuits that lack isolation diode 16 and/or diode-connected transistor string 18.

In an unpowered state, such as when the chip is not installed on a printed circuit board, or when the chip is installed on a printed circuit board but not powered, the voltages on signal pad 21 and power pads 26, 39 may be nominally zero, since any voltages previously applied to the chip tend to bleed off over time. The capacitor 34 may therefore be fully discharged, so that the input of the inverter 22 is at zero volts relative to the power supply inputs 36, 38. During a positive voltage ESD event, the voltage on signal pad 21 may rise significantly relative to the power pads 26, 39, which may forward bias the isolation diode 16 and increase the voltage on the supply line 20. As the voltage on the supply line 20 rises, the diode-connected transistor string 18 may become reverse biased, which isolates the power pad 26 from the ESD voltage as well as prevents the supply line voltage from being dissipated in other parts of the chip. The inverters 22-24 may thereby be provided with power during a positive voltage ESD event by the ESD pulse.

Because the capacitor 34 may be at zero volts at the beginning of the ESD event, the input of inverter 22 may initially be at low voltage level relative to the supply line 20. This may cause inverter 22 to output a high logic level voltage, which in turn will cause the signal outputs of inverters 23 and 24 to output low and high logic levels, respectively. The output of inverter 23 may thus drive the voltage of the n-trigger gate 28 below the voltage of the anode 46 of SCR 12, forward biasing the emitter-base junction of transistor Q1 and causing the transistor Q1 to enter a low impedance state. The transistor Q1 may thereby shunt the ESD current from the signal pad 21 to the p-trigger gate 30 (i.e., base of transistor Q2) so that the shunted ESD current works cooperatively with the logic high output voltage of inverter 24 to switch the transistor Q2 into a low impedance state by similarly forward biasing the base-emitter junction of transistor Q2. The resulting low impedance state of the SCR 12 electrically couples the signal pad 21 to the power pad 39 through the SCR 12, which discharges the ESD pulse to the power pad 39. Because either one of the SCR triggering signals supplied by the inverters 23 and 24 individually may be sufficient to trigger the SCR 12 into a low-impedance state, alternative embodiments may rely on triggering the SCR 12 by applying trigger voltages to the n-trigger gate 28 only, or the p-trigger gate 30 only. Once triggered, the SCR 12 may remain in the low impedance state until the shunted ESD current drops below a threshold known as the holding current. The SCR 12 may thereby remain in a low impedance state until the ESD pulse has dissipated.

The time constant of RC circuit 31 may be set sufficiently long so that the RC-trigger circuit 14 is responsive to ESD events, but short enough to allow the RC-trigger circuit 14 to quickly reach a normal operational state when power is applied to the chip. For example, the RC time constant produced by the RC circuit 31 may be between 10 nano-seconds and 1 micro-second. Upon initial application of power to the chip, the input to inverter 22 may remain at a voltage representing a logic low for a period of time until capacitor 34 charges to a voltage level at or above the voltage threshold between a logic low and logic high state. The output of inverters 23 and 24 may thus initially trigger the SCR 12 so that the SCR 12 is in a low-impedance state. However, absent any voltage sources coupled to the signal pad 21 sufficient to supply the SCR holding current, the SCR 12 will return to a high impedance state once the capacitor voltage reaches the minimum value for a logic high voltage.

Figure 2A:
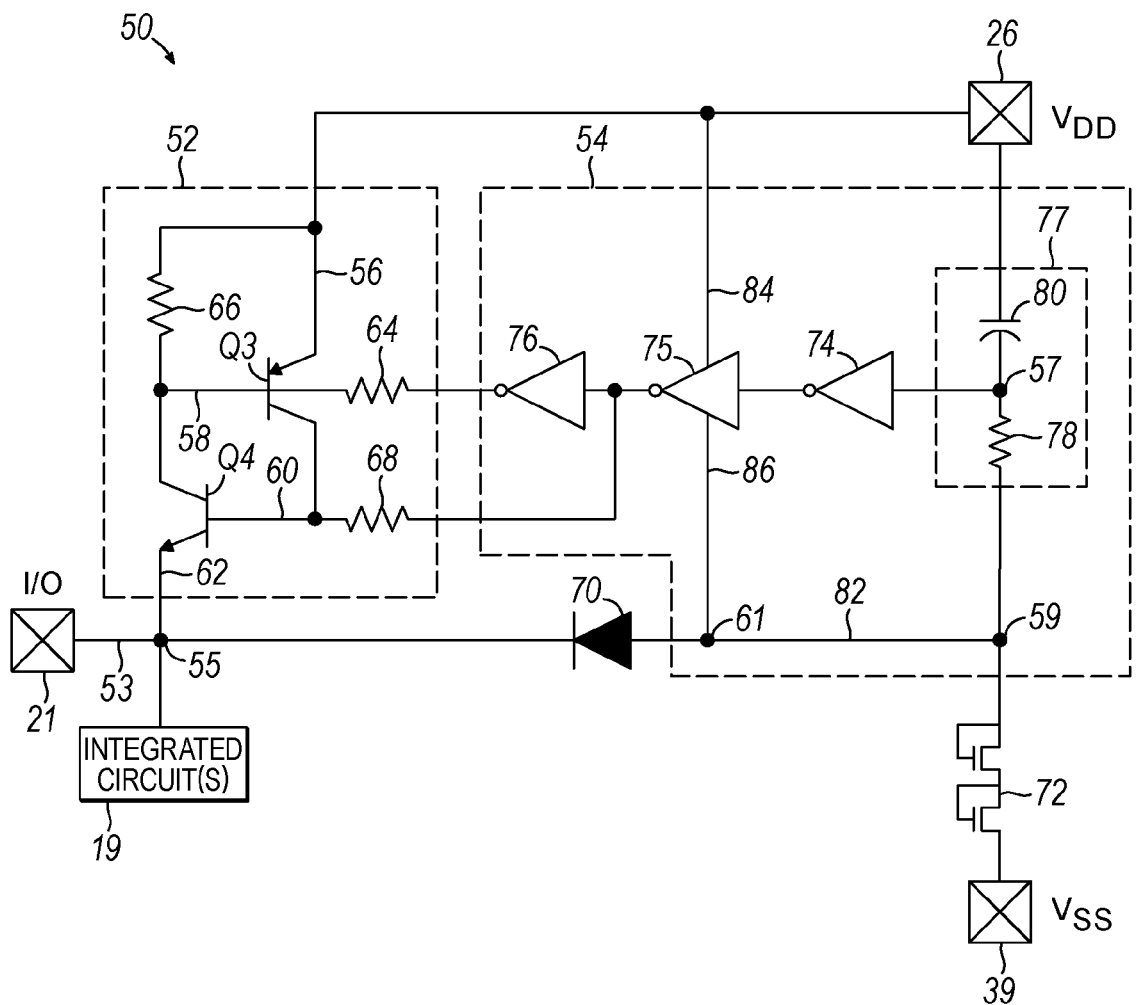
FIG. 2A is a diagrammatic view illustrating the electrical configuration of an ESD protection circuit used to provide protection against negative voltage ESD pulses to an I/O signal pad coupled with an I/O pin.

With reference to FIG. 2A in which like reference numerals refer to like features in FIG. 1A and in accordance with an embodiment of the invention, an ESD protection circuit 50 used for negative-voltage ESD protection includes an SCR 52, a resistor-capacitor (RC) trigger circuit 54, a pad isolation diode 70, and a diode-connected transistor string 72. The SCR 52 may be comprised of adjacent regions of alternating n-type and p-type semiconductor configured to form a PNPN structure in essentially the same manner as previously described with regard to the SCR 12 in FIG. 1A. A PNP bipolar transistor Q3 may be formed by three adjacent regions of the PNPN structure. An emitter region of the transistor Q3 may be comprised of an anode 56 of the SCR 52, which may be defined by the first p-region. The first p-region may be a p+ contact region formed within the first n-region, which may be an n-well. A base region of the transistor Q3 may be comprised of an SCR n-trigger gate 58 defined by the first n-region of SCR 52. A collector region of transistor Q3 may be comprised of the second p-type region of the SCR 52, which may be a p-well laterally abutting the first n-region. An NPN bipolar transistor Q4 may be formed by three adjacent regions of the PNPN structure. A base region of transistor Q4 shares the same p-region of SCR 52 as the collector of transistor Q3 and forms a p-trigger gate 60 of SCR 52. A collector region of transistor Q4 shares the same n-region of SCR 52 with the base of transistor Q3. The emitter region of transistor Q4 may be defined by a cathode 62 of SCR 52, which may be an n+ contact region formed within the second p-region.

The SCR 52 may be used to provide ESD protection to sensitive devices of integrated circuit(s) 19 on the chip, which are electrically coupled to the I/O signal pad 21 through signal path 53. To protect against negative voltage ESD pulses, the cathode 62 of SCR 52 may be electrically coupled to the integrated circuit(s) 19 and signal path 53 at a signal node 55. The anode 56 of SCR 52 may then be electrically coupled to power pad 26, which is electrically coupled to $V_{DD}$ during operation. An ESD path for negative voltage ESD pulses is thereby defined through the transistors Q3, Q4 from the signal pad 21 to the power pad 26. Under normal operating conditions, the SCR 52 will present a high impedance between the signal node 55 and $V_{DD}$, so that the signals passing through signal path 53 to the integrated circuit(s) 19 may be relatively unaffected by the SCR 52. When an ESD event occurs, the SCR 52 may enter into a low impedance state, providing a current path between the signal node 55 and $V_{DD}$ so that the ESD current is shunted away from the integrated circuit(s) 19. The SCR may thereby prevent ESD voltages from damaging the integrated circuit(s) 19.

Similarly to SCR 12, electrical contacts with the n-trigger and p-trigger gates 58, 60 may be formed by resistive contact regions of more highly doped semiconductor having the same conductivity type as the first n-region and second p-region, respectively. Resistors 64, 66 may thereby be provided by the electrical resistance of the first n-region forming the base of transistor Q3. Likewise, resistor 68 may be provided by the electrical resistance of the second p-region forming the base of transistor Q4.

The RC-trigger circuit 54 includes a supply line 82, inverters 74-76, and a resistor-capacitor (RC) circuit 77. RC circuit 77 includes a resistor 78 and a capacitor 80 connected in series, which forms a common node 57 between the resistor 78 and capacitor 80. RC circuit 77 is electrically coupled to the anode of diode-connected transistor string 72 at node 59, node 59 being between the resistor 78 and the diode-connected string 72. The anode of isolation diode 70 may be electrically coupled to an inverter negative supply node 61, and the cathode of isolation diode 70 may be electrically coupled to signal node 55, so that the pad isolation diode 70 connects the signal node 55 to the supply node 61. The cathode of transistor string 72 may be electrically coupled to power pad 39, so that node 59 is connected to power pad 39 by transistor string 72. Inverters 74-75 may be supplied with power by a negative power supply input 86 and a positive power supply input 84, which may be electrically coupled to power pad 26. The supply line 82 may connect node 59 to node 61, so that the anode of diode-connected transistor string 72, the resistor 78, the anode of isolation diode 70, and the negative power supply input 86 of the inverters 74-76 are electrically coupled to each other by supply line 82. Thus, as illustrated in FIG. 2A, the supply line 82 is electrically coupled to a signal pad 21 by the pad isolation diode 70 and to the power pad 39 by the diode-connected transistor string 72.

Figure 2B:
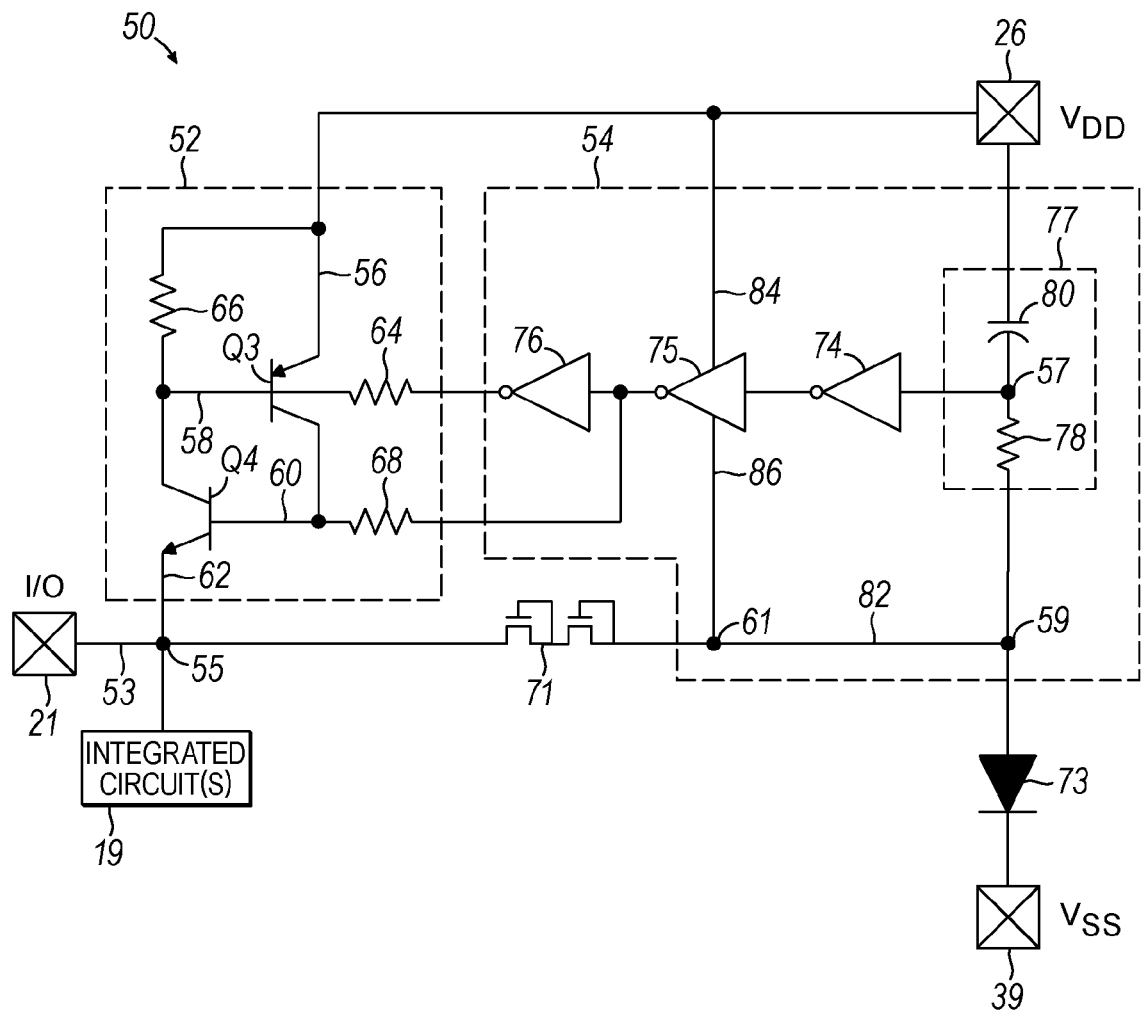
FIG. 2B is a diagrammatic view similar to FIG. 2A illustrating an alternative electrical configuration of an ESD protection circuit used to provide protection against negative voltage ESD pulses directed to an I/O signal pad coupled with an I/O pin.
Figure 2C:
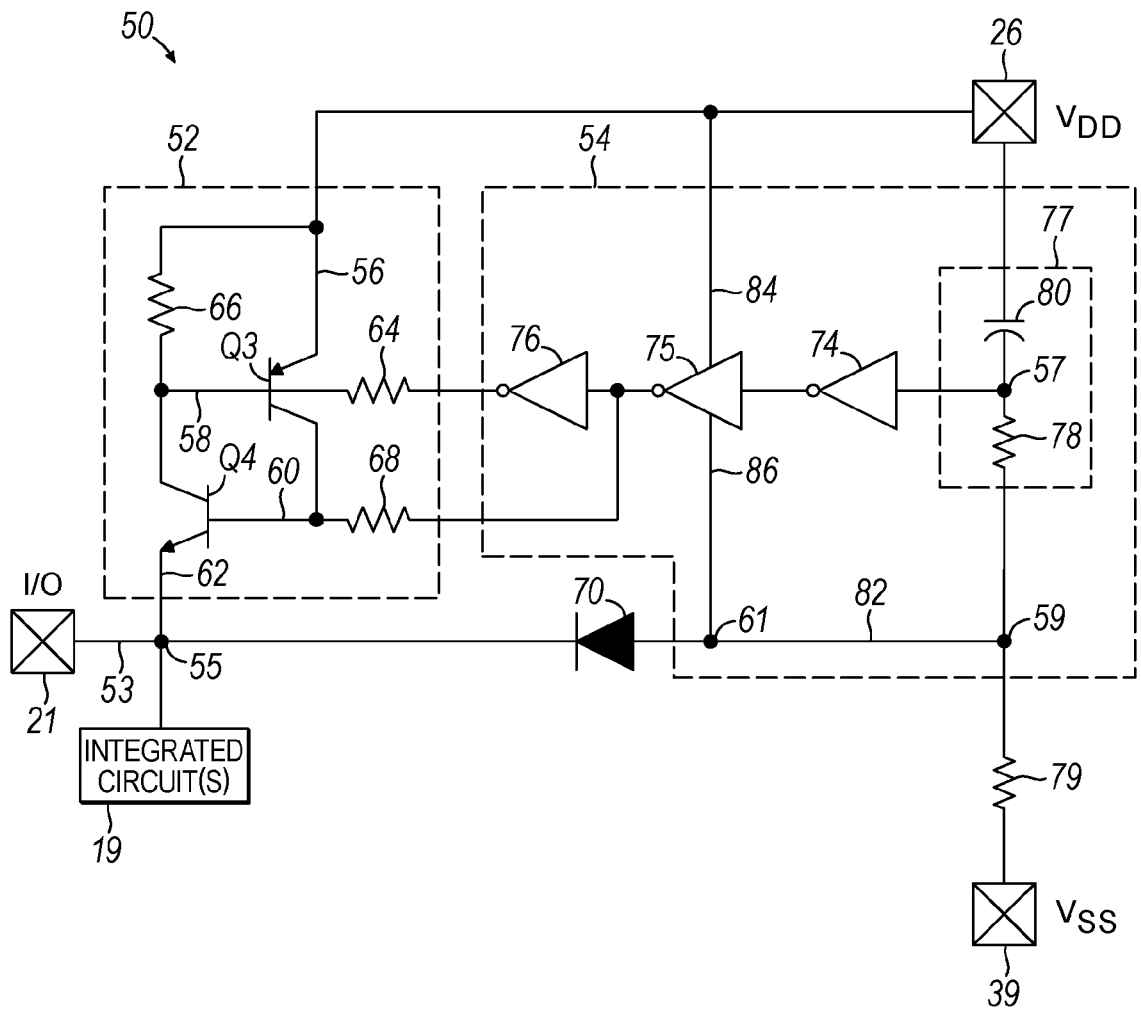
FIG. 2C is a diagrammatic view similar to FIG. 2A illustrating another alternative electrical configuration of an ESD protection circuit used to provide protection against negative voltage ESD pulses directed to an I/O signal pad coupled with an I/O pin.

As illustrated in FIG. 2B and similarly as described with respect to ESD protection circuit 10, in alternative embodiments of the invention, the diode 70 may be replaced a diode-connected transistor string 71, and/or the transistor string 72 may be replaced by a diode 73. It is therefore understood that either type of device may be used interchangeably in either position. In another alternative embodiment, the diode-connected transistor string 72 may be replaced by a large resistor 79 (e.g., greater than or equal to 100 kΩ) as shown in FIG. 2C.

The inverters 74-76 may be connected in series, with the signal output of inverter 75 electrically coupled to the p-trigger gate 60 by resistor 68, and the signal output of inverter 76 electrically coupled to the n-trigger gate 58 by resistor 64, so that the inverters 75, 76 may provide trigger signals to the SCR 52. The n-trigger gate 58 may also be electrically coupled to a power pad 26 by resistor 66.

Although illustrated in a double-triggered SCR configuration in FIG. 2A, the SCR 52 may also be configured as a single-triggered SCR, in which case only one of either the n-trigger or p-trigger gates 58, 60 would be electrically coupled to its respective inverter signal output. In addition, because the n-trigger gate 58 is driven with a logic signal that is not inverted with respect to the voltage on capacitor 80, one or more non-inverting logic buffer amplifiers may be used to couple the RC circuit 77 to the n-trigger gate 58 in place of one or more of the inverters 74-76.

The input of inverter 74 is electrically coupled to the supply line 82 by resistor 78 and is electrically coupled to the power pad 26 by capacitor 80 so that the response of the inverter output to changes in the supply line voltage may be delayed. The positive power supply input 84 for the inverters 74-76 may be electrically coupled to power pad 26, and the negative power supply input 86 for the inverters 74-76 may be electrically coupled to the supply line 82 so that the inverters 74-76 are supplied with power whenever a sufficient voltage difference exists between the power pad 26 and supply line 82.

Similarly as described with respect to ESD protection circuit 10, a BEOL interconnect structure may be used to define wiring paths between signal pad 21, power pad 26, power pad 39, SCR 52, RC-trigger circuit 54, isolation diode 70, and diode-connected transistor string 72. The metallization may define a wire forming signal path 53 coupling the signal pad 21 with the local interconnect wiring of the cathode 62 of SCR 52, the cathode of pad isolation diode 70, and integrated circuit(s) 19. The metallization may define a wiring path coupling the power pad 39 with the local interconnect wiring for the cathode of diode-connected transistor string 72. The metallization may define a wiring path coupling the power pad 39 with the local interconnect wiring for the anode 56 of SCR 52, the positive power supply input 84 of inverters 74-76, and the capacitor 80.

In operation, power pad 26 may be electrically coupled to a positive chip supply voltage, such as $V_{DD}$, and power pad 39 may be electrically coupled to a negative chip supply voltage, such as ground or $V_{SS}$. Under these normal operating conditions, the diode-connected transistor string 72 may become forward biased, which electrically couples the supply line 82 to $V_{SS}$. Supply line 82 may thereby be biased to a voltage approaching $V_{SS}$. The resulting voltages appearing across the inverter power supply inputs 84, 86 may provide power to the inverters 74-76 as well as charge the RC circuit capacitor 80 through resistor 78. The resulting supply line voltages may also reverse bias the pad isolation diode 70. The resulting increase in the depletion region width may reduce the junction capacitance of the diode 70 and thereby electrically isolate the signal pad 21 from parasitic loading by the RC circuit capacitor 80 and the inverter string power supply input 86.

Shortly after power is applied to the chip, capacitor 80 may become sufficiently charged so that the input of inverter 74 is at or below a voltage level representing a logic low signal. In response, the output of inverter 74 may drive the input of inverter 75 high, causing the output of inverter 75 to apply a logic level low voltage to resistor 68, which drives the p-trigger gate 60 to a voltage at or slightly above the voltage applied to the negative power supply input 86. The p-trigger gate 60 may thus be provided with a voltage at or slightly above $V_{SS}$, depending on the voltage drops associated with the diode-connected transistor string 72 and within the inverter 75. The p-trigger gate 60 may thus be at a lower voltage than signal pad 21, reverse biasing the base-emitter junction of transistor Q4 and minimizing the parasitic capacitive loading of SCR 52 on the signal pad 21 by increasing the width of the depletion region in the base-emitter junction. Similarly, the output of inverter 75 may drive the input of inverter 76 to a logic low state, so that the output of inverter 76 applies a logic level high voltage to the resistor 64, driving the n-trigger gate 58 to a voltage at or slightly below $V_{DD}$. The transistor Q3 may thereby be placed in an off state so that the voltage on the p-trigger gate 60 is not pulled up by the transistor Q3, which maintains the SCR 52 in a high impedance or non-conductive state.

The RC-trigger circuit 54 maintains SCR 52 in the high impedance state when the chip is powered. In addition, the RC-trigger circuit 54 may reduce the parasitic capacitive loading on the signal pad 21 by reverse biasing the pad isolation diode 70 and the SCR base-emitter junction of transistor Q4. The RC-trigger circuit 54 may thereby offer reduced capacitive loading of signal pad 21 in comparison to conventional RC-triggered SCR ESD protection circuits that lack isolation diode 70 and/or diode-connected transistor string 72.

As with RC-trigger circuit 14, when the chip is in an unpowered state, such as before the chip is installed on a printed circuit board or when the printed circuit board is not powered, capacitor 80 may be fully discharged, so that the input of inverter 74 is at zero volts relative to power supply inputs 84, 86. During a negative voltage ESD event, the voltage on signal pad 21 may fall significantly relative to the power pads 26, 39, which forward biases the pad isolation diode 70 and decreases the voltage on the supply line 82. As the voltage of supply line 82 falls, the diode-connected transistor string 72 may become reverse biased, which isolates power pad 39 from the ESD voltage as well as prevents the supply line voltage from being dissipated in other parts of the chip. The inverters 74-76 may thereby be provided with power during a negative voltage ESD event by the ESD pulse.

Because capacitor 80 may be at zero volts at the beginning of the ESD event, the input of inverter 74 may initially be at high voltage level relative to the supply line 82, which is being pulled down by the negative ESD pulse. This may cause inverter 74 to output a low logic level voltage, which in turn will cause the output of inverters 75 and 76 to output high and low logic levels, respectively. The output of inverter 75 may thus drive the voltage of the p-trigger gate 60 above the voltage of the SCR cathode 62, forward biasing the emitter-base junction of transistor Q4 and causing transistor Q4 to enter a low impedance state. Transistor Q4 may thereby shunt the ESD current from the signal pad 21 to the n-trigger gate 58 (i.e., base of transistor Q3) so that the shunted ESD current works cooperatively with the logic low output voltage of the inverter 76 to switch transistor Q3 into a low impedance state by similarly forward biasing the base-emitter junction of transistor Q3. The resulting low impedance state of SCR 52 electrically couples the signal pad 21 to the power pad 26 through the SCR 52, which discharges the ESD pulse to the power pad 26. Because either one of the SCR triggering signals supplied by the inverters 75 and 76 individually may be sufficient to trigger the SCR 52 into a low-impedance state, alternative embodiments may rely on triggering the SCR 52 by applying trigger voltages to the n-trigger gate 58 only or p-trigger gate 60 only. Once triggered, the SCR 52 may remain in the low impedance state until the shunted ESD current drops below the holding current. The SCR 52 may thereby remain in a low impedance state until the ESD pulse has dissipated.

The time constant of the RC circuit 77 may be set sufficiently long so that the RC-trigger circuit 54 is responsive to negative ESD events, but short enough to allow the RC-trigger circuit 54 to quickly reach a normal operational state when power is applied to the chip. For example, the RC time constant produced by the RC circuit 77 may be between 10 nano-seconds and 1 micro-second. Upon initial application of power to the chip, the input to inverter 74 may remain at a voltage representing a logic high for a period of time until capacitor 80 charges to a voltage level at or below the voltage threshold between a logic low and logic high state. The output of inverters 75 and 76 may thus initially trigger the SCR 52 so that SCR 52 is in a low-impedance state. However, absent any voltage sources coupled to the signal pad 21 sufficient to supply the SCR holding current, the SCR 52 will return to a high impedance state once the capacitor voltage reaches the minimum value for a logic low voltage.

Figure 3:
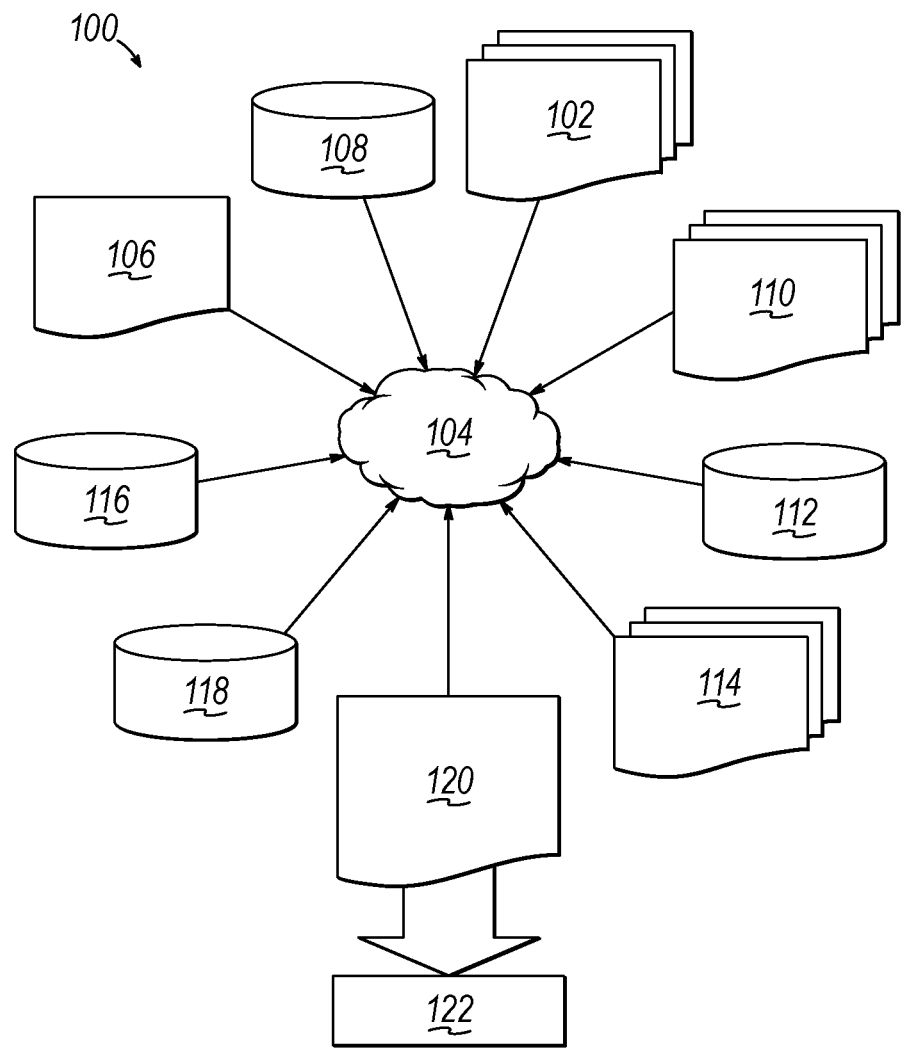
FIG. 3 is a flow diagram of a design process used in semiconductor design, manufacture, and/or test.

FIG. 3 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1A-1C and 2A-2C. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1A-1C and 2A-2C. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1A-1C and 2A-2C to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1A-1C and 2A-2C. In one embodiment, design structure 120 may comprise a compiled, executable HDL simulation model that functionally simulates the devices shown in FIGS. 1A-1C and 2A-2C.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1A-1C and 2A-2C. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A circuit for protecting an integrated circuit from an electrostatic discharge (ESD) event, the circuit comprising:
   a trigger circuit including a first resistor and a capacitor coupled in series with the resistor;
   a semiconductor-controlled rectifier coupled to the trigger circuit, the semiconductor-controlled rectifier having an anode and a cathode;
   a signal pad coupled to the anode or the cathode of the semiconductor-controlled rectifier and the integrated circuit at a first node; and
   a first diode having a first terminal coupled to the first node and a second terminal coupled to the first resistor of the trigger circuit at a second node,
   wherein the first diode is configured to isolate the signal pad from the trigger circuit when the integrated circuit is powered, and the first diode is configured to couple the signal pad to the trigger circuit in response to the ESD event and when the integrated circuit is unpowered.

2. The circuit of claim 1 further comprising:
   a power supply pad; and
   a second diode coupling the first resistor of the trigger circuit to the power supply pad, the second diode configured to couple the trigger circuit to the power supply pad in the absence of the ESD event and to isolate the trigger circuit from the power supply pad during the ESD event.

3. The circuit of claim 2 wherein the second diode is at least one diode-connected transistor.

4. The circuit of claim 1 further comprising:
   a power supply pad; and
   a second resistor coupling the first resistor of the trigger circuit to the power supply pad, the second resistor having an electrical impedance sufficient to couple the trigger circuit to the power supply pad in the absence of the ESD event and to isolate the trigger circuit from the power supply pad during the ESD event.

5. The circuit of claim 1, wherein the trigger circuit includes a first inverter having a signal input and a signal output responsive to a voltage at the signal input of the first inverter, and the trigger circuit is coupled with the signal input of the first inverter at a third node between the first resistor and the capacitor.

6. The circuit of claim 5, wherein the first inverter includes a power supply input coupled to a supply line voltage, and the trigger circuit is configured to delay a response of the first inverter to changes in the supply line voltage.

7. The circuit of claim 5 wherein the semiconductor-controlled rectifier includes an n-trigger gate and a p-trigger gate, the anode of the semiconductor-controlled rectifier is coupled to the signal pad, and further comprising:
   a power supply pad coupled to the cathode of the semiconductor-controlled rectifier.

8. The circuit of claim 7 wherein the trigger circuit includes a second inverter having a signal input and a signal output responsive to a voltage at the input of the second inverter, the signal output of the first inverter is coupled to the signal input of the second inverter, and the signal output of the second inverter is coupled to the n-trigger gate of the semiconductor-controlled rectifier.

9. The circuit of claim 8 wherein the trigger circuit includes a third inverter having a signal input and a signal output responsive to a voltage at the signal input of the third inverter, the signal input of the third inverter is coupled to the signal output of the second inverter, and the signal output of the third inverter is coupled to the p-trigger gate of the semiconductor-controlled rectifier.

10. The circuit of claim 5 wherein the semiconductor-controlled rectifier includes an n-trigger gate and a p-trigger gate, the cathode of the semiconductor-controlled rectifier is coupled to the signal pad, and further comprising:
    a power supply pad coupled to the anode of the semiconductor-controlled rectifier.

11. The circuit of claim 10 wherein the trigger circuit includes a second inverter having a signal input and a signal output responsive to a voltage at the signal input of the second inverter, the signal output of the first inverter is coupled to the signal input of the second inverter, and the signal output of the second inverter is coupled to the p-trigger gate of the semiconductor-controlled rectifier.

12. The circuit of claim 11 wherein the trigger circuit further includes a third inverter having a signal input and a signal output responsive to a voltage at the signal input of the third inverter, the signal input of the third inverter is coupled to the signal output of the second inverter, and the output of the third inverter is coupled to the n-trigger gate of the semiconductor-controlled rectifier.

13. The circuit of claim 1 wherein the first diode is at least one diode-connected transistor.

14. A method of fabricating an integrated circuit with protection from an electrostatic discharge (ESD) event, the method comprising:
    coupling a signal pad to a semiconductor-controlled rectifier;
    coupling the semiconductor-controlled rectifier to a resistor-capacitor (RC-) trigger circuit;
    coupling the signal pad to an anode or a cathode of the semiconductor-controlled rectifier and the integrated circuit at a first node;
    coupling a first terminal of a first diode to the first node; and coupling a second terminal of the first diode to the first resistor of the trigger circuit at a second node,
wherein the first diode is configured to isolate the signal pad from the RC-trigger circuit when the integrated circuit is powered, and the first diode is configured to couple the signal pad to the RC-trigger circuit in response to the ESD event and when the integrated circuit is unpowered.

15. The method of claim 14 wherein the signal pad is coupled by a back-end-of-line signal path to the anode of the semiconductor-controlled rectifier.

16. The method of claim 14 wherein the signal pad is coupled by a back-end-of-line signal path to the cathode of the semiconductor-controlled rectifier.

17. The method of claim 14 further comprising:
coupling the first resistor of the RC-trigger circuit to a power supply pad with a second diode,
wherein the second diode is configured to couple the power supply pad to the first resistor of the trigger circuit in the absence of an ESD event and to electrically isolate the power supply pad from the RC-trigger circuit in response to an ESD event.

18. The method of claim 14 further comprising:
coupling the RC-trigger circuit to the power supply pad with a second resistor having an electrical impedance sufficient to couple the RC-trigger circuit to the power supply pad in the absence of an ESD event and to isolate the RC-trigger circuit from the power supply pad during an ESD event.

19. A method of protecting an integrated circuit from an electrostatic discharge (ESD) event at a signal pad, the method comprising:
in response to the integrated circuit being powered, isolating a resistor-capacitor (RC-) trigger circuit from the signal pad with a diode while coupling the integrated circuit and the signal pad with an anode or a cathode of a semiconductor-controlled rectifier that is in a high impedance state; and
in response to the ESD event at the signal pad and while the integrated circuit is unpowered, coupling the RC-trigger circuit to the signal pad through the diode by forward biasing the diode so that the RC-trigger circuit triggers the semiconductor-controlled rectifier to enter a low impedance state and direct current from the ESD event to the anode or cathode of the semiconductor-controlled rectifier.

20. The method of claim 19 further comprising:
in response to the integrated circuit being powered, coupling a capacitor of the RC-trigger circuit to a power supply pad; and
in response to an ESD event at the signal pad and while the integrated circuit is unpowered, isolating the trigger circuit from the power supply pad during the ESD event.

21. A hardware description language (HDL) design structure encoded on a machine-readable data storage medium, the HDL design structure comprising elements that when processed in a computer-aided design system generates a machine-executable representation of a circuit for protecting an integrated circuit during an electrostatic discharge (ESD) event, the HDL design structure comprising:
a trigger circuit including a first resistor and a capacitor coupled in series with the resistor;
a semiconductor-controlled rectifier coupled to the trigger circuit, the semiconductor-controlled rectifier having an anode and a cathode;
a signal pad coupled to the anode or the cathode of the semiconductor-controlled rectifier and the integrated circuit at a first node; and
a diode having a first terminal coupled to the first node and a second terminal coupled to the first resistor of the trigger circuit at a second node,
wherein the diode is configured to isolate the signal pad from the trigger circuit when the integrated circuit is powered, and the first diode is configured to couple the signal pad to the trigger circuit in response to the ESD event and when the integrated circuit is unpowered.

22. The HDL design structure of claim 21 wherein the HDL design structure comprises a netlist.

23. The HDL design structure of claim 21 wherein the DHL design structure resides on storage medium as a data format used for the exchange of layout data of integrated circuits.

24. The HDL design structure of claim 21 wherein the HDL design structure resides in a programmable gate array.

* * * * *